United States Patent
Lien et al.

(10) Patent No.: US 12,142,326 B2
(45) Date of Patent: *Nov. 12, 2024

(54) ADAPTIVE PROGRAMMING DELAY SCHEME IN A MEMORY SUB-SYSTEM

(71) Applicant: MICRON TECHNOLOGY, INC., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 143 days.

This patent is subject to a terminal disclaimer.

(21) Appl. No.: 17/752,590

(22) Filed: May 24, 2022

(65) Prior Publication Data
US 2023/0386583 A1 Nov. 30, 2023

(51) Int. Cl.
G11C 16/10 (2006.01)
G11C 16/32 (2006.01)
G11C 16/34 (2006.01)
G11C 16/04 (2006.01)

(52) U.S. Cl.
CPC ............ *G11C 16/32* (2013.01); *G11C 16/10* (2013.01); *G11C 16/349* (2013.01); *G11C 16/0483* (2013.01)

(58) Field of Classification Search
CPC .............. G11C 16/0483; G11C 16/102; G11C 16/08; G11C 16/26; G11C 16/32
See application file for complete search history.

(56) References Cited

U.S. PATENT DOCUMENTS

| | | | |
|---|---|---|---|
| 10,101,931 B1 * | 10/2018 | Camp | G06F 12/0866 |
| 10,650,896 B1 * | 5/2020 | Yang | G11C 11/5628 |
| 2012/0030412 A1 * | 2/2012 | Dhakshinamurthy | G11C 16/0483 711/E12.008 |
| 2019/0066771 A1 * | 2/2019 | Binfet | G11C 16/24 |
| 2019/0250843 A1 * | 8/2019 | Ratnam | G06F 3/0673 |
| 2020/0185034 A1 * | 6/2020 | Liikanen | G11C 16/10 |
| 2021/0109826 A1 * | 4/2021 | Bueb | G11C 11/409 |
| 2022/0199165 A1 * | 6/2022 | Nguyen | G11C 16/26 |

* cited by examiner

*Primary Examiner* — Mushfique Siddique
(74) *Attorney, Agent, or Firm* — Lowenstein Sandler LLP

(57) ABSTRACT

A system includes a memory device and a processing device operatively coupled to the memory device. The processing device is to receive a programming command with respect to a set of memory cells coupled to one or more wordlines of the memory device. The processing device is further to determine a value of a metric reflecting a state of the set of memory cells. The processing device is further to determine a delay based on the value of the metric. The processing device is further to perform a programming operation with respect to the subset of memory cells. The programming operation includes the delay between a first pass of the programming operation and a second pass of the programming operation.

20 Claims, 9 Drawing Sheets

| Delay | PE Cycles | | | | |
|---|---|---|---|---|---|
| WL Group | 431 | 432 | 433 | 434 | 435 |
| Group 1 | 441 | 442 | 443 | 444 | 445 |
| Group 2 | 451 | 452 | 453 | 454 | 455 |
| Group 3 | 461 | 462 | 463 | 464 | 465 |
| WL | PE Cycles | | | | |
| WL Group | 431 | 432 | 433 | 434 | 435 |
| Group 1 | x0 | x0-x1 | x0-x2 | x0-x2 | x0-x3 |
| Group 2 | x1-x8 | x2-x8 | x3-x7 | x4-x7 | x4-x6 |
| Group 3 | x9-x10 | x9-x10 | x8-x10 | x8-x10 | x7-x10 |

ADAPTIVE PROGRAMMING DELAY SCHEME IN A MEMORY SUB-SYSTEM

TECHNICAL FIELD

Embodiments of the disclosure relate generally to memory sub-systems, and more specifically, relate to an adaptive programming delay scheme memory in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
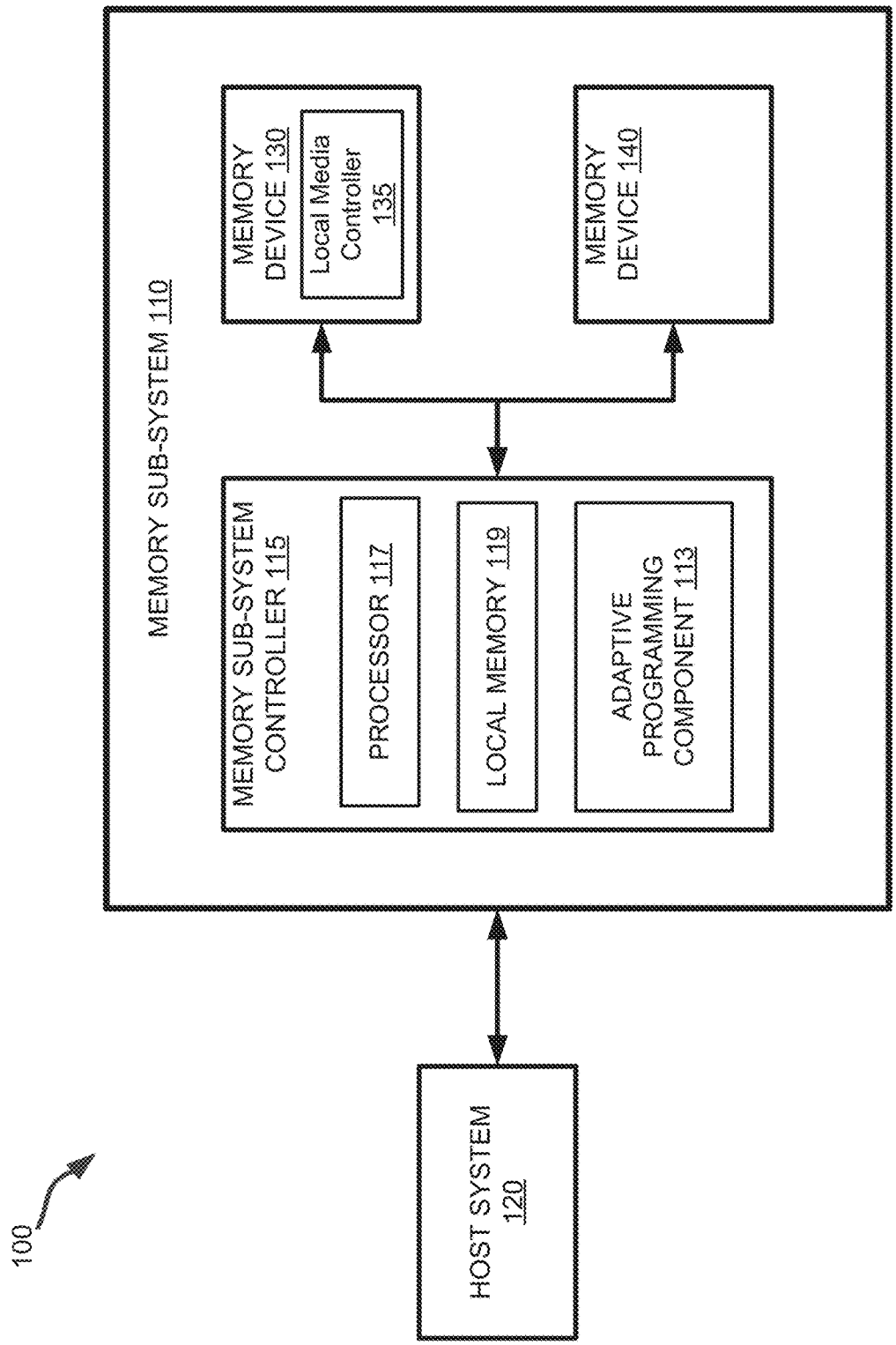
FIG. 1A illustrates an example computing system that includes a memory sub-system, in accordance with some embodiments of the present disclosure.

Aspects of the present disclosure are directed to an adaptive programming delay scheme for multi-pass (e.g., two-pass) programming in a memory sub-system. A memory sub-system can be a storage device, a memory module, or a combination of a storage device and memory module. Examples of storage devices and memory modules are described below in conjunction with FIG. 1A. In general, a host system can utilize a memory sub-system that includes one or more memory components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1A. A non-volatile memory device is a package of one or more dice. Each die can include one or more planes. A plane is a portion of a memory device that includes multiple memory cells. Some memory devices can include two or more planes. For some types of non-volatile memory devices (e.g., NAND devices), each plane includes a set of physical blocks. Each block includes a set of pages. "Block" herein shall refer to a set of contiguous or non-contiguous memory pages. A "block" may refer to a unit of the memory device used to store data and can include a group of memory cells. An example of a "block" is an "erasable block," which is the minimal erasable unit of memory, while "page" is a minimal writable unit of memory. Each page includes a set of memory cells. A memory cell is an electronic circuit that stores information.

A memory device can include multiple memory cells arranged in a two-dimensional grid. The memory cells are formed onto a silicon wafer in an array of columns and rows. A memory cell includes a capacitor that holds an electric charge and a transistor that acts as a switch controlling access to the capacitor. Accordingly, the memory cell may be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command, programming command, etc.) to the memory sub-system, such as to store data on a memory device at the memory sub-system and to read data from the memory device on the memory sub-system.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and quad level cells (QLC) physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Some memory devices, e.g., quadruple-level cell (QLC) memory devices (i.e., memory devices storing 4-bit value per cell) can utilize a multi-pass (e.g., two-pass) programming scheme to mitigate program disturb. Program disturb refers to a phenomenon where a bit is unintentionally programmed from a "1" to a "0" (or vice-versa) during a page-programming operation. The two-pass programming scheme introduced by QLC memory devices specifies that the same data is to be programmed to the same QLC memory twice, via a "first pass" and a "second pass". Each pass involves applying a wordline bias voltage to wordlines to which memory cells of a selected page are connected. For example, during a programming operation, one or more selected memory cell can be programmed with the application of a programming voltage to a selected wordline. Application of the programming voltage to the selected wordline may increase a charge level, and thereby a threshold voltage, of each memory cell connected to that wordline. Data programmed to QLC memory is not available to service read operations after the first programming pass and is considered finalized and ready to service read operations after the second programming pass. As the data is programmed to QLC memory is not available to service read operations until the data is finalized by the second programming pass, the data can also be programmed to a single level cell (SLC) memory cache (i.e., a portion of memory that stores 1-bit value per cell). The data programmed to the SLC cache can be available to service read operations before the second programming pass for the data in QLC memory.

Susceptibility to program disturb may increase over a lifetime of the memory device. For example, performing a programming operation on a given memory cell may slightly degrade the memory cell, affecting the read window budget (RWB), which is a metric reflecting the difference between adjacent threshold voltage distributions and/or the reliability of the memory cell. RWB is associated with the rate at which data can be read from or stored in a memory cell. The memory cell may degrade during/after each successive program-erase cycle (PE cycle). Over a number of program-erase cycles (PE cycles), the memory cell may degrade, have a lowered reliability, have a lowered RWB, and/or be more susceptible to program disturb. Each subsequent PE cycle may further degrade the memory cell. Over a lifetime of PE cycles, the memory cell may degrade such that the memory cell is significantly more susceptible to program disturb than when the memory cell was new. The RWB of the memory cell may suffer over a number of PE cycles. Over a number of PE cycles, especially a high number of PE cycles, the memory cell may degrade enough that conventional two-pass programming methods and sequences are not enough to fully or successfully mitigate the program disturb for the degraded memory cell.

When a memory device is new (e.g., a number of PE cycles is close to zero), a small number of memory cells may be susceptible to program disturb (e.g., only a small number of memory cells may be unreliable). After a certain number of PE cycles, more memory cells of the memory device may degrade past a predetermined reliability threshold, affecting a RWB of the memory device. Specifically, more memory cells coupled to a given wordline may degrade past the reliability threshold as the number of PE cycles increases. Additionally, more memory cells associated with (e.g., coupled to) more wordlines may degrade past the reliability threshold as the number of PE cycles grows. The memory cells having degraded past the reliability threshold may be more susceptible to program disturb. Conventional two-pass programming methods and sequences may not fully or successfully mitigate the program disturb for the degraded memory cells.

Aspects of the present disclosure address the above and other deficiencies of conventional programming methods and sequences by providing an adaptive programming delay scheme for programming memory devices. In some embodiments, the adaptive programming delay scheme described herein results in an adjusted programming sequence. Upon receiving a command to program a set of memory cells, a memory sub-system controller may determine the value of a chosen reliability metric (e.g., the PE cycle count) of the set of memory cells. The set of memory cells may include memory cells coupled to one or more wordlines of a memory block. Based on the reliability metric value, the controller may determine the delay to be performed between the first pass of the programming operation and the second pass programming operation.

In some implementations, the delay between the $1^{st}$ pass and the $2^{nd}$ pass may be applied to the memory cells exhibiting heightened, in comparison to other memory cells, susceptibility to program disturb (e.g., have a lower memory cell reliability). The controller may also program the memory cells in a particular order (e.g., a programming sequence) that minimizes the number of delays to optimize programming performance in light of the included delay to reduce a total duration of aggregated included delays.

Advantages of the present disclosure include, but are not limited to, providing an adaptive programming delay scheme for programming operations that more fully mitigates program disturb as a PE cycle count increases over a lifetime of the memory device. The adaptive programming delay scheme may account for a degradation of the memory cells affecting the reliability of the memory cells. The adaptive programming delay scheme described herein may be adaptable for a PE cycle count of a memory device over a lifetime of the memory device. The adaptive programming delay scheme may adapt a delay between a first pass of programming operation and a second pass of the programming operation based on a value of a metric received (e.g., PE cycle count). Including the delay between the first pass and the second pass may increase a RWB of the memory cells, thereby increasing reliability and mitigating program disturb. Adapting the delay may provide for an increase in reliability without sacrificing performance more than needed to achieve a sufficient mitigation of program disturb. Additionally, the adaptive programming delay scheme described herein may utilize a program sequence which further increases performance while incorporating the adaptive delay between the first pass and the second pass. The above leads to a higher effective RWB of the memory device, mitigation of program disturb, better reliability, and higher performance when compared to conventional systems and methods. As a result, a significant amount of system resources are available for other processes, reducing overall system latency and increasing overall system efficiency.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, PE cycle counting (e.g., counting PE cycles of memory devices 130, etc.), and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations (e.g., programming operations, two-pass programming operations, etc.) on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an adaptive programming component 113 that can determine a two-pass program operation delay and/or a two-pass program operation sequence associated with a memory device 130, 140. In some embodiments, the memory sub-system controller 115 includes at least a portion of the adaptive programming component 113. For example, the memory sub-system controller 115 can include a processor 117 (e.g., processing device) configured to execute instruction stored in local memory 119 for performing the operation described herein. In some embodiments, the adaptive programming component 113 is part of the host system 120, an application, or an operating system.

Adaptive programming component 113 can implement two-pass programming operations with a pre-computed delay between the first and second passes at memory sub-system 110. In some embodiments, one or more portions of memory devices 130, 140 can include single level memory cells (SLCs) (referred to herein as a SLC portion). As described above, a SLC refers to a portion of memory that is configured to store 1-bit per memory cell. One or more additional portions of memory devices 130, 140 can include memory that is configured to store more than 1-bit per memory cell. For example, the one or more additional portions of memory devices 130, 140 can include one or more QLCs memory cells.

Memory sub-system controller 115 can receive a request from host system 120 to execute a programming operation with respect to a set of memory cells (e.g., a block) of a memory device 130, 140. Memory sub-system controller 115 can receive a PE cycle count of a subset of the set of memory cells, in some embodiments. The subset of the set of memory cells may be memory cells coupled to wordlines of a wordline group of a block. For example, the subset of memory cells may be coupled to one of first group of wordlines (e.g., wordlines one through five, etc.) of a block. The subset of memory cells may be a first (e.g., first sequentially) subset of memory cells of the block to be programmed according to the programming operation. The PE cycle count may be measured (e.g., by a controller and/or other processing device) as the PE cycle count increases. PE cycle count may be an indicator of memory cell reliability. Memory sub-system control 115 can determine a delay to be included between a first pass and a second pass in accordance with a two-pass programming scheme associated with QLC memory, in some embodiments. The delay may be implemented between a first pass operation and a second pass operation of the programming scheme. In some embodiments, the memory sub-system controller 115 can determine a program sequence in accordance with the programming scheme. The program sequence may be chosen depending upon the delay and/or the reliability metric (e.g., the PE cycle count) of the memory cells. For example, where the delay is above a delay threshold, a program sequence may be chosen (e.g., from two or more program sequence choices) to minimize a number of delays between sub-operations of the programming operation so that the total latency (e.g., total time of aggregate delay durations) is minimized. The delay threshold may be a predetermined delay duration that triggers a change in program sequence. In another example, where the PE cycle count of the memory cells falls above a PE cycle count threshold, a program sequence may be chosen and/or determined to mitigate low memory cell reliability associated with high PE cycle count.

In some embodiments, the memory sub-system control 115 can perform the programming operation with respect to the set of memory cells of memory device 130, 140. The memory sub-system 115 may include the determined delay between a first pass operation and a second pass operation of the programming operation. Further details regarding the adaptive programming delay scheme are provided herein.

Figure 1B:
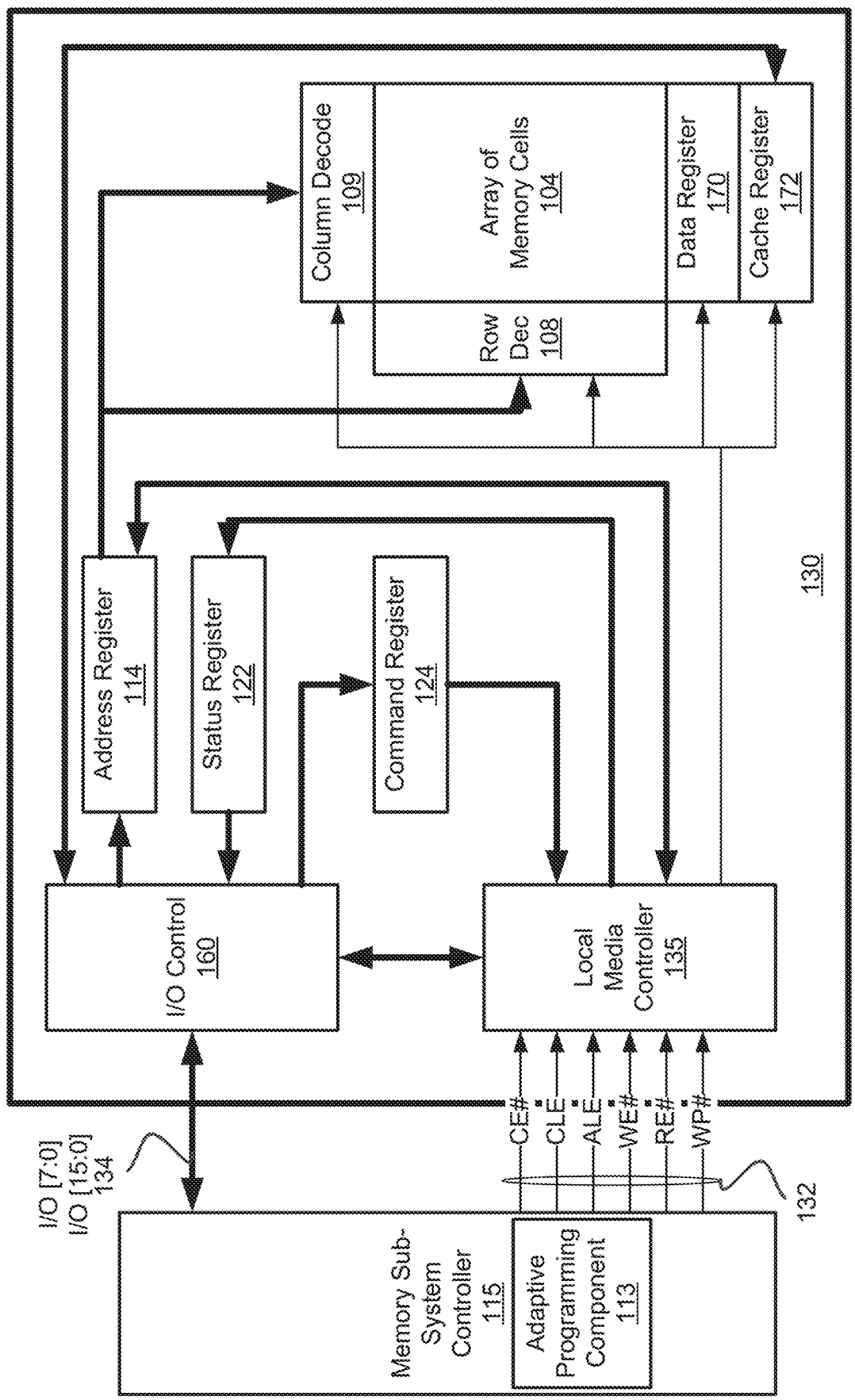
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. In one embodiment, memory sub-system controller 115 includes adaptive programming component 113 configured to perform the programming operations described herein including two-pass programming operations having a delay between a first pass operation and a second pass operation.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2B:
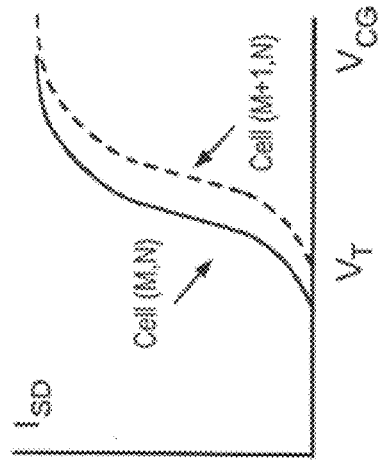
FIG. 2B illustrates schematically dependence of the source-drain current on the control gate voltage for two non-identical memory cells having different threshold control gate voltages, in accordance with some implementations of the present disclosure.
Figure 2A:
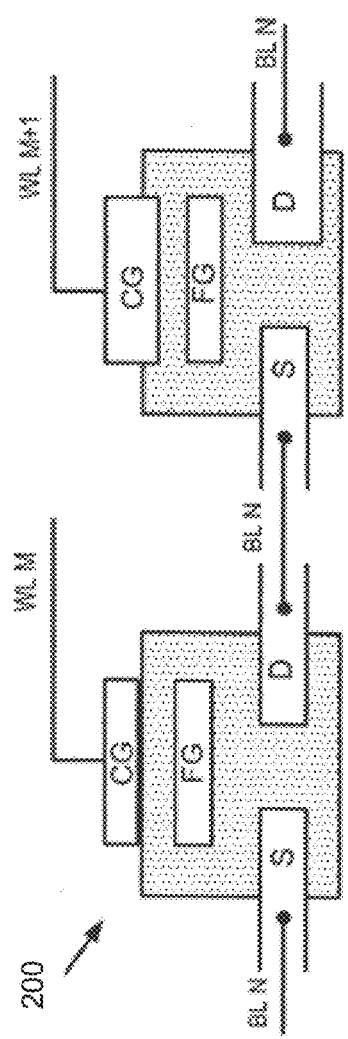
FIG. 2A illustrates schematically floating gate transistor-based memory cells as arranged in a memory device, in accordance with some implementations of the present disclosure.

FIG. 2A illustrates schematically floating gate transistor-based memory cells as arranged in a memory device, in accordance with some implementations of the present disclosure. Among memory devices 130, 140 can be one or more memory devices (e.g., NAND, NOR, a cross-point array) that utilize transistor arrays built on semiconductor chips. As illustrated schematically in FIG. 2A, a memory cell of a memory device can be a transistor, such as metal-oxide-semiconductor field effect transistor (MOSFET), having a source (S) electrode and a drain (D) electrode to pass electric current there through. The source and drain electrodes can be connected to a bitline (BL). Multiple memory cells can share a bitline, as in NAND memory devices, in one implementation. For example, two memory cells 202 and 204 illustrated in FIG. 2A can be connected to the same bitline N and two different wordlines, M and M+1, respectively.

Alternatively, e.g., in NOR memory devices, each memory cell can have a dedicated bitline that is not shared with other memory cells. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG} < V_T$, the source-drain electric current can be low, but can increase substantially once the control gate voltage has exceeded the threshold voltage, $V_{CG} > V_T$. Because the actual geometry of gates and electrodes of a memory cell (as well as the environment of the memory cell) can vary from cell to cell, the threshold voltages $V_T$ can be different even for transistors implemented on the same die. For example, as illustrated in FIG. 2A, memory cell 204 can include gates and electrodes having different sizes. As a result, transistors of the same memory device can be characterized by a distribution of their threshold voltages, $P(V_T) = dW/dV_T$, so that $dW = P(V_T)dV_T$ represents the probability that any given transistor has its threshold voltage within the interval $[V_T, V_T+dV_T]$. For example, FIG. 2B illustrates schematically dependence of the source-drain current $I_{SD}$ on the control gate voltage for two non-identical memory cells, e.g. memory cell 202 (solid line) and memory cell 204 (dashed line), having different threshold control gate voltages, in one exemplary implementation.

To make a memory cell non-volatile, the cell can be further equipped with a conducting island—a floating gate (FG)—that can be electrically isolated from the control gate, the source electrode, and the drain electrode by insulating layers (depicted in FIG. 2A as the dotted region). In response to an appropriately chosen positive (in relation to the source potential) control gate voltage $V_{CG}$, the floating gate can receive (via Fowler-Nordheim tunneling or hot electron injection) a negative electric charge Q, which can be permanently stored thereon even after the power to the memory cell—and, consequently, the source-drain current—is ceased. The charge Q can affect the distribution of threshold voltages $P(V_T,Q)$. Generally, the presence of the negative charge Q shifts the distribution of threshold voltages towards higher voltages, compared with the distribution $P(V_T)$ for an uncharged floating gate. This happens because a stronger positive control gate voltage $V_{CG}$ can be needed to overcome a negative potential of the floating gate charge Q. If any charge of a sequence $Q_k$ of charges with $1 \leq k \leq 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N-1$ valley margins.

Figure 2C:
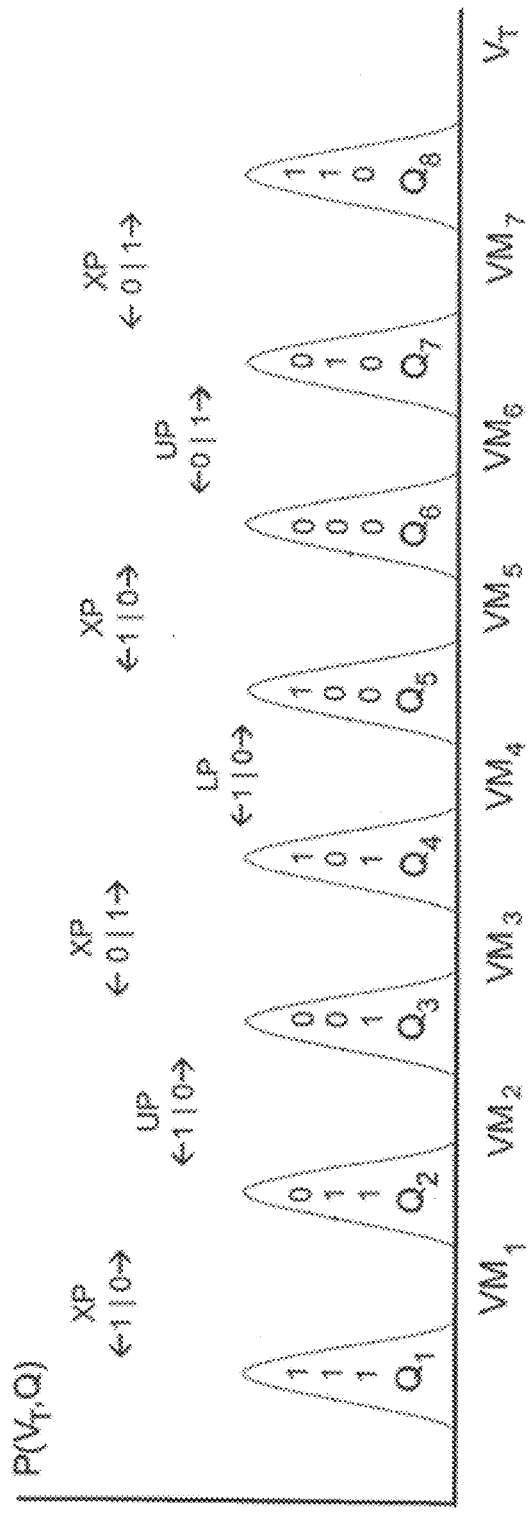
FIG. 2C illustrates schematically a distribution of threshold control gate voltages for a flash memory cell capable of storing three bits of data by programming the memory cell into at least eight charge states that differ by the amount of charge on the cell's floating gate in accordance with some implementations of the present disclosure FIG. 3 provides one exemplary depiction of a physical partitioning of a memory component that illustrates a type of geometric information that can be provided by the memory controller to the host system, in accordance with some implementations of the present disclosure.

FIG. 2C illustrates schematically a distribution of threshold control gate voltages for a memory cell capable of storing three bits of data by programming the memory cell into at least eight charge states that differ by the amount of charge on the cell's floating gate. FIG. 2C shows distributions of threshold voltages $P(V_T, Q_k)$ for $2^N=8$ different charge states of a tri-level cell (TLC) separated with $2^3-1=7$ valley margins $VM_k$. Accordingly, a memory cell programmed into a charge state k-th (i.e., having the charge $Q_k$ deposited on its floating gate) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

In general, storage devices with NAND memory are classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In some storage devices, each wordline of the memory can have the same type of cells within a given partition of the memory device. That is, all wordlines of a block or a plane are SLC memory, or all wordlines are MLC memory, or all wordlines are TLC memory, or all wordlines are QLC memory. Because an entire wordline is biased with the same control gate voltage $V_{CG}$ during write or read operations, a wordline in SLC memory typically hosts one memory page (e.g., a 16 KB or a 32 KB page) that is programmed in one setting (by selecting various bitlines consecutively). A wordline of a higher-level (MLC, TLC, or QLC) memory cell can host multiple pages on the same wordline. Different pages can be programmed (by the memory sub-system controller 115 via electronic circuitry) in multiple settings. For example after a first bit is programmed on each memory cell of a wordline, adjacent wordlines can first be programmed before a second bit is programmed on the original wordline. This can reduce electrostatic interference between neighboring cells. As explained above, the memory sub-system controller 115 can program a state of the memory cell and then read can read this state by comparing a read threshold voltage $V_T$ of the memory cell against one or more read level thresholds. The operations described herein can be applied to any N-bit memory cells.

For example, a TLC can be capable of being in one of at least eight charging states $Q_k$ (where the first state can be an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory sub-system controller 115.

The read operation can be performed after a memory cell is placed in one of its charged states $Q_k$ by a previous write operation. For example, to program (write) 96 KB (48 KB) of data onto cells belonging to a given wordline M of a TLC, a first programming pass can be performed. The first programming pass can store 32 KB (16 KB) of data on the wordline M by placing appropriate charges on the floating gates of memory cells of the workline M. For example, a charge Q can be placed on the floating gate of a specific cell. A cell is programmed to store value in its lower-page (LP) bit if the cell is driven to any of the charge states $Q_1$, $Q_2$, $Q_3$, or $Q_4$. The cell is programmed to store value 0 in its LP bit if the cell is driven to any of the charge states $Q_5$, $Q_6$, $Q_7$, or $Q_8$. As a result, during a read operation it can be determined that the applied control gate voltage $V_{CG}$ placed within the fourth valley margin $VM_4$ is sufficient to open the cell to the source-drain electric current. Hence, it can be concluded that the cell's LP bit is in state 1 (being in one of the charge states $Q_k$ with k≤4). Conversely, during the read operation it can be determined that the applied control gate voltage $V_{CG}$ within the fourth valley margin is insufficient to open the cell to the source-drain electric current. Hence, it can be concluded that the cell's LP bit is in state 0 (being in one of the charge states $Q_k$ with k>4).

After cells belonging to the M-th wordline have been programmed as described, the LP has been stored on the M-th wordline and the programming operation can proceed with additional programming passes to store an upper page (UP) and an extra page (XP) on the same wordline. Although such passes can be performed immediately after the first pass is complete (or even all pages can be programmed in one setting), in order to minimize errors it can be advantageous to first program LPs of adjacent wordlines (e.g., wordlines M+1, M+2, etc.) prior to programming UP and XP into wordline M. Indeed, due to electrostatic interaction between electric charges, charges that are placed on a given wordline can modify threshold voltages of memory cells belonging to adjacent wordlines (as well as thresholds of memory cells within the same wordline). Therefore, it can be disadvantageous to have significantly different charges on neighboring memory cells. Accordingly, it can be beneficial—from the perspective of minimizing occurrences of erroneously programmed bits—to program adjacent wordlines incrementally. For example, programming of a LP on wordline M can be followed with programming of a LP on wordline M+1, followed with programming an LP into wordline M+2, followed with programing an UP into wordline M, and so on, with virtually unlimited number of possible sequences of programming various pages on various wordlines.

When the UP is to be programmed into wordline M, a charge state of a memory cell can be adjusted so that its distribution of threshold voltages is further confined within a known valley margins VM. For example, a cell that is in one of the charge states $Q_1$, $Q_2$, $Q_3$, or $Q_4$ (accorded bit 1 status for LP programming) can be driven to just one of two states $Q_1$ or $Q_2$, in which case the cell is to store value 1 in its UP bit. Conversely, a cell can be driven to one of two states $Q_3$ or $Q_4$ to store value 0 in its UP bit. As a result, during a read operation it can be determined that the applied control gate voltage $V_{CG}$ within the second valley margin $VM_2$ is sufficient to open the cell to the source-drain electric current. Hence, it can be concluded that the cell's UP bit is in state 1 (being in one of the charge states $Q_k$ with k≤2). Conversely, during a read operation it can be determined that the applied control gate voltage $V_{CG}$ within the second valley margin $VM_2$ is insufficient to open the cell to the source-drain electric current. Hence, it can be concluded that the cell's UP bit is in state 0 (being in one of the charge states $Q_k$ with 2<k≤4). Likewise, charge states $Q_5$, $Q_6$, $Q_7$, or $Q_8$ (accorded bit 0 status for LP programming) can be further driven to the states $Q_5$ or $Q_6$ (UP bit value 0) or the states $Q_7$ or $Q_8$ (UP bit value 1).

Similarly, the extra page (XP) can be programmed into the wordline M by further adjusting the charge state of each its memory cell. For example, a cell that is in the logic state 10 (i.e., UP bit stores value 1 and LP bit stores value 0) and is in one of the charge states $Q_7$ or $Q_8$ can be driven to state $Q_7$ to store value 0 in its XP bit (logic state 010). Alternatively, the cell can be driven to charge state $Q_8$ to store value 1 in its XP bit. As a result, during a read operation it can be determined that the applied control gate voltage $V_{CG}$ within the seventh valley margin is insufficient to open the cell to the source-drain electric current. Hence, it the memory sub-system controller 115 can determine that the cell's logic state is 110 (corresponding to charge state $Q_7$). Conversely, during a read operation it can be determined that the applied control gate voltage $V_{CG}$ within the seventh valley margin $VM_7$ is sufficient to open the cell to the source-drain electric current. Hence, the memory controller 215 can determine that the cell's XP bit stores value 0. If it is further determined that control gate voltages $V_{CG}$ within the first six valley margins are insufficient to open the cell to the electric current, the memory controller 215 can ascertain the logic state of the cell as 010 (corresponding to the charge state $Q_7$).

Figure 3:
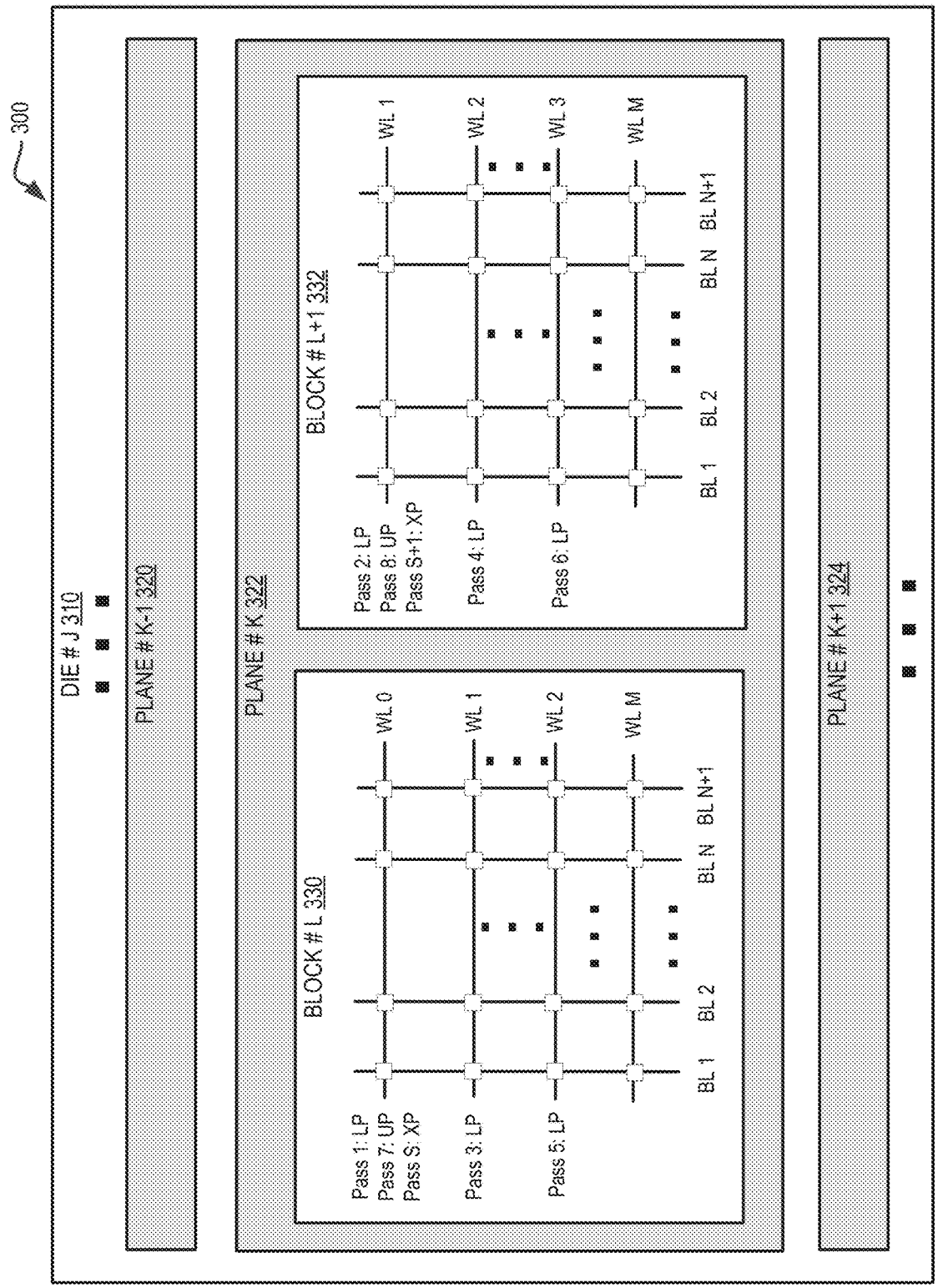

FIG. 3 provides one exemplary depiction 300 of a physical partitioning of a memory device (e.g., memory devices 130, 140) that illustrates a type of geometric information that can be provided by the memory sub-system controller 115 to the host system 120, in one implementation. A memory subsystem 110 can have one or more memory devices 130, 140, such as NAND, NOR, cross-point array, and the like. The memory devices 130, 140 can include one or more dies. One exemplary die J (310) out of a possible plurality of dies is depicted on FIG. 3. One or more planes can be positioned on the same die. Exemplary planes K−1 (320), K (322), and K+1 (324) are depicted on FIG. 3. Each plane can include one or more blocks of memory. Exemplary plane K is shown to have a plurality of memory blocks, such as exemplary blocks L (330) and L+1 (332). Each block can include an array of memory cells that can be connected to a plurality of wordlines (WL) and a plurality of bitlines (BL). A circuitry that can be used to selectively couple WLs and BLs to voltage sources providing control gate and source-drain signals, respectively, is not explicitly depicted in FIG. 3.

Geometric information can include one or more geometric parameters that describe an order in which data is to be programmed into one or more memory devices 130, 140 of the memory sub-system 110. Geometric parameters can be provided to the host system 120 prior or during execution of one or more applications. The geometric parameters can include indications of the capacity of a single memory cell. For example, the geometric parameters can include the number of bits N to be stored on a single memory cell: N=1 for a SLC, N=2 for a MLC, N=3 a TLC, N=4 for a QLC, and so on. The capacity of a memory cell can be variable, in some instances. For example, in some implementations, the memory sub-system controller 115 can program the memory device differently depending on a time of programming, a type and a number of applications being executed on the host system 120, and so on. For example, when one (or merely a few) applications are running on the host system 120, the memory sub-system controller 115 can program the entire memory device or any number of its partitions (dies, planes, blocks, wordlines) to have a lower value N (such as 1 or 2) to maximize reliability of the memory media, in one implementation. On the other hand, when the host system 120 needs to execute many applications, the memory sub-system controller 115 can reprogram the memory device or some of its partitions to store more bits N (e.g., 3, 4, or more) on a single memory cell, in order to increase storage capacity. In some implementations, the number of bits N stored on a memory cell can vary from one partition to another. Correspondingly, the memory sub-system controller 115 can provide a plurality of values N for various partitions of one or more memory devices 130, 140. For example, the geometric parameters can provide that memory cells of plane 1 are to store N=2 bits of data whereas memory cells of plane 2 belonging to the first L blocks are to store N=4 bits of data, and the rest of the blocks of plane 2 are to store N=3 bits of data.

A memory cell capacity, provided as part of geometric parameters, can be as simple as a single value N, referring to all partitions of the memory device, in some implementations. In more advanced implementations, however, geometric parameters can contain a much more detailed information, including providing separate N values for a plurality or even—in some instances—for all partitions (dies, planes, blocks, and wordlines) of the memory device.

The values N provided to the host system 220 can be static, i.e. can be provided once for every loading of an application or once every m times the application is started. The same values N can be provided every time the application is started. In some implementations, however, the values N can be provided to the host system dynamically. Namely, the controller 115 can update geometric parameters (including values N) periodically or every time the geometric parameters are changed. For example, the memory sub-system controller 115 can reprogram some of the partitions of the memory device to increase (or decrease N) the number of bits stored on the memory cells thereof. Following such reprogramming of the memory partitions, the memory sub-system controller 115 (e.g., a component of the memory sub-system controller 115) can provide updated geometric parameters to the host system 120. In some implementations, the memory sub-system controller 115 can detect hardware deterioration (e.g, age-induced deterioration) of some partitions and determine that a specific partition can no longer provide reliable storage of data if the cells are used as a TLC or QLC and reprogram such cells for use as MLC or SLC (e.g., by marking those cells for such use). Accordingly, the memory sub-system controller 115 can provide this updated information to the host system 120, either right after the cells are marked for new uses, or at regular time intervals where updates are scheduled.

Geometric parameters provided to the host system 220 (e.g., by a component of the memory sub-system controller 115) can further include a number of memory cells in a single wordline. This information, coupled with knowledge of the number N bits stored in each of the memory cells of a wordline, can indicate the size (e.g., 16 KB, 32 KB, or any other value) of a memory page that can be stored on a single wordline. Similarly, the geometric parameters can include a number of wordlines in a single block, a number of blocks in a single plane, a number of planes in a single die, a number of dies in the memory component(s) 212, and similar information about sizes of various partitions of the memory component(s) 212. In some implementations, such sizes can be determined globally for the entire (one or more) memory component(s) 212. In other implementations, the size of any of the aforementioned partitions can vary between different locations of the memory device. For example, some blocks can have 32 wordlines, while some can have 64 or 128 wordlines, or any other number of wordlines. In some implementations, the number of cells on a single wordline and the number of wordlines within a single block does not have to be separately included in the geometric parameters provided to the host system 120. Instead, the memory sub-system controller 115 can provide the bit-capacity of a single block without specifying the internal topology of the block (i.e., its partitioning into wordlines and the size of the wordlines).

The memory sub-system controller 115 can supplement the topology of the memory device(s) 130, 140 with a mapping information for that topology, and include the mapping information in the geometric information provided by the memory sub-system controller 115 to the host system 120. Such mapping information can include descriptors intended to communicate to the host system 220 how logical addresses of the memory media used by the host system, e.g., LBAs, correspond to various physical partitions of the memory component(s) 212. More specifically, the mapping information can include an LBA increment (separation) corresponding to different partitions of the memory device(s) 130, 140. For example, geometric parameters can include LBA increments for the same wordlines. More specifically, in one implementation, geometric parameters can include LBA increments between LP of a wordline (programmed on the first pass) and an UP and an XP (programmed on the second and third passes, respectively) of the same wordline. Similarly, geometric parameters can include LBA increments between, e.g., LPs (or UPs, XPs) of adjacent wordlines and/or non-adjacent wordlines. In case where LBA increments are provided for non-adjacent wordlines, geometric parameters can also include a corresponding physical separation between the wordlines (e.g., 7, 10, or 15 intervening wordlines).

The memory sub-system controller 115 can provide similar information in reference to larger partitions (blocks, planes, dies, and the like). In some implementations, where LBA-to-physical address correspondence remains static over the lifetime of an application (e.g., the time between application restarts), the memory system controller 115 can also include base LBAs for various partitions. For example, a base LBA for a block, plane, or die can be a first LBA that is to be programmed onto the corresponding partition. For example, if LBA XYZ01 corresponds to a memory page that is to be stored starting with WL 0 of plane K, this information can be included into geometric parameters.

In some implementations, LBA increments and/or base LBAs can be dynamic and can change during the lifetime of the application. In such implementations, the memory sub-system controller 115 can periodically provide updated mapping information to the host system 120, in the same way as described above for updates of the topology of the memory device(s) 130, 140.

In addition to providing the topology and/or mapping information of the memory device, as described above, the memory sub-system controller 115 can additionally provide programming information as part of the geometric parameters. For example, programming information can include programming sequence for programming various partitions of the memory device. More specifically, geometric parameters can include a sequence of programming of various wordlines within a single block as well as a sequence of programming various blocks, planes, and dies. For example, FIG. 3 illustrates one exemplary programming sequence when two blocks 330 and 332 are programmed concurrently (rather than consequentially). For example, a first programming pass can program the first wordline (WL 0, as depicted) of block 330. Moreover, only a low page (LP) can be stored on WL 0 initially. A second programming pass can similarly program an LP stored on WL 0 of block 332. A third programming pass can program a LP of WL 1 of the block 330, followed by a fourth programming pass to program a LP of WL 1 of the block 332, while a fifth (sixth) programming pass can program a LP of WL 2 of the block 330 (block 332). The seventh pass can return to WL 0 of the block 330 to program an upper page (UP) on WL 0 and the eighth pass can program an UP on WL 0 of the block 332. An XP on WL 0 can be programmed later, during S-th pass, which can occur after some UPs and yet more additional LPs have been programmed on both blocks 330 and 332. The exemplary sequencing shown in FIG. 3 is intended for illustration only. A person skilled in the art will recognize that the number of possible sequencing schemes for programming operations is virtually unlimited. Selection of one or more sequencing schemes that the memory sub-system controller 115 can use to program one or more memory devices 130, 140 can be accomplished with an objective of minimizing electrostatic interference between neighboring memory cells (wordlines, blocks, etc.), maximizing the write or read speed, and so on. Accordingly, any number of dies, planes, blocks, wordlines, or any other partitions can be programmed concurrently, as illustrated in FIG. 3.

Accordingly, the geometric parameters can include one or more sequencing schemes that can be used by the controller 115 to program one or more memory devices 130, 140. The controller 115 can use different sequencing schemes depending on the type of applications running on the host system 120. The geometric parameters can further include indications regarding sequencing schemes can be used under specific conditions, e.g. to store data for various applications. The programming information (including the sequencing schemes) does not have to remain static and can be modified by the memory sub-system controller 115. If the programming scheme is modified, the memory sub-system controller 115 may update the host system 120 with the new programming information.

Figure 4A:
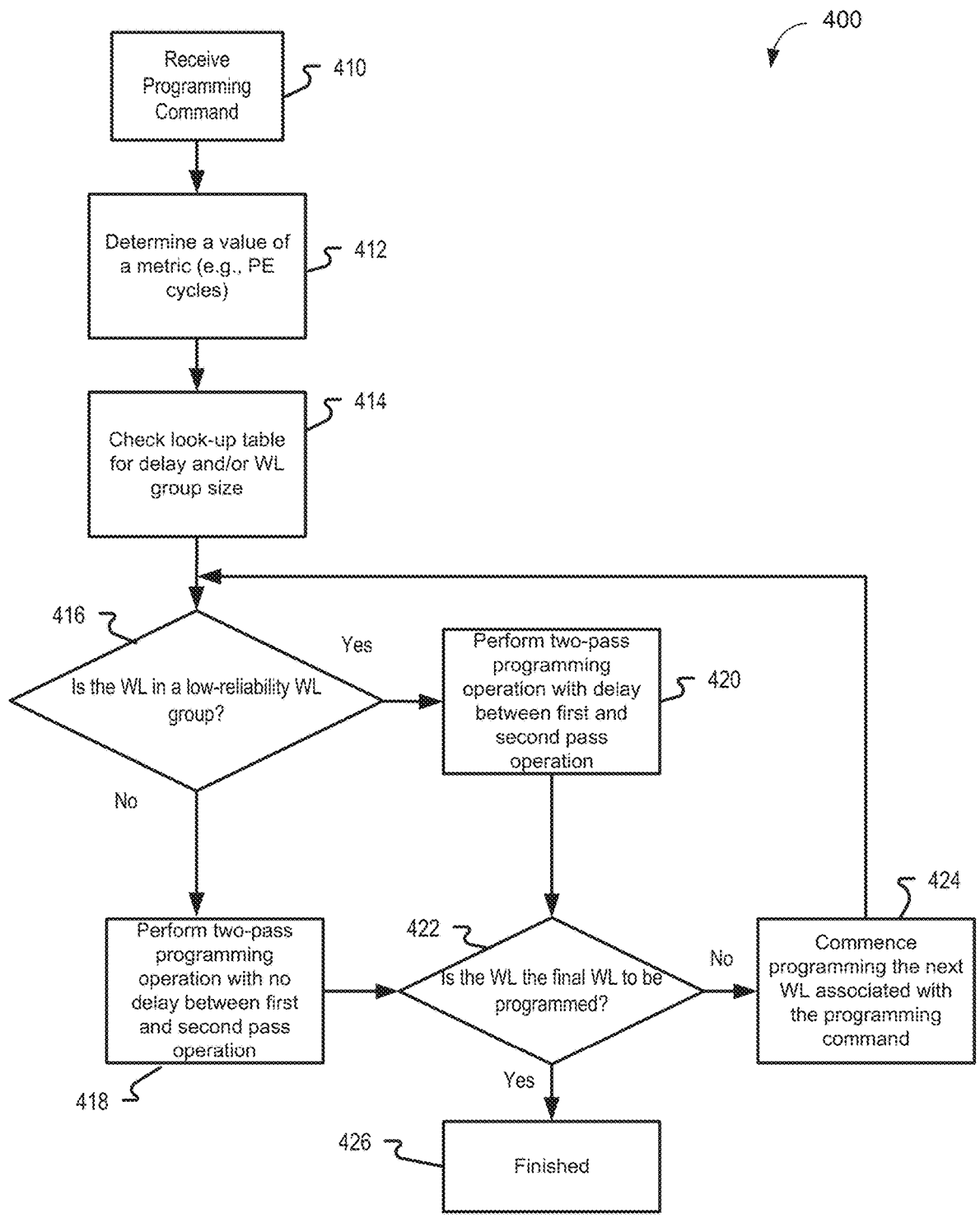
FIG. 4A is a flow diagram for an example method for implementing an adaptive programming delay scheme at a memory sub-system, in accordance with some embodiments of the present disclosure.
Figure 4B:
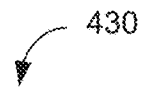
FIG. 4B illustrates a structure of a look-up table for implementing an adaptive programming delay scheme at a memory sub-system, in accordance with some embodiments of the present disclosure.

FIG. 4A is a flow diagram for an example method 400 for implementing an adaptive programming delay scheme for two pass programming at a memory sub-system, in accordance with some embodiments of the present disclosure. FIG. 4B illustrates a structure of a look-up table for implementing an adaptive programming delay scheme (e.g., embodied by method 400) at a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the adaptive programming component 113 of FIG. 1A. In other or similar embodiments, one or more operations of method 400 is performed by another component of the memory sub-system controller 115, or by a component of local media controller 135. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, in some embodiments, a controller (e.g., memory sub-system controller 115 of FIG. 1A, a controller of adaptive programming component 113, etc.) receives a programming command. The programming command may be a programming command corresponding to one or more memory cells of a memory device (e.g., memory device 130 of FIG. 1A). In some embodiments, the programming command is received from a host device (e.g., host system 120 of FIG. 1A). In some embodiments, the programming command is received with respect to at least a set of memory cells (e.g., QLCs, SLCs, etc.). The set of memory cells may be a set of memory cells coupled to one or more wordlines (e.g., of a memory block). In some embodiments, the one or more wordlines includes multiple wordlines, each wordline coupled to multiple memory cells. The set of memory cells may include the multiple memory cells coupled to each wordline of the one or more wordlines. The programming command may correspond to multiple wordlines (e.g., memory cells each coupled to a wordline of one or more multiple wordlines).

At block 412, in some embodiments, the controller determines a first value of a first metric. The value and/or the metric may reflect a state of the subset of the set of memory cells. The first value of the first metric may be determined responsive to receiving a second value of a second metric. In an example, the controller receives a PE cycle count associated with a subset of the set of memory cells. The PE cycle count may be indicative of a reliability of the subset of memory cells. For instance, the PE cycle count may indicate the subset of memory cell's susceptibility to program disturb during a programming operation (e.g., a two-pass programming operation). For example, a memory cell with a high PE cycle count may be more susceptible to program disturb (e.g., have a lower reliability). A memory cell with a low PE cycle count may be less susceptible to program disturb (e.g., have a higher reliability).

At block 414, in some embodiments, the controller checks a look-up table (e.g., look-up table 430 of FIG. 4B) for a predetermined delay and/or a size of a wordline group. The wordline group may be a low-reliability wordline group and/or a wordline group of concern. Memory cells coupled to wordlines of the wordline group may have a low reliability and/or a heightened susceptibility to program disturb.

Referring to FIG. 4B, look-up table 430 may correlate given PE cycle counts with predetermined delay durations and/or wordline group sizes. In some embodiments, look-up table 430 stores values that are associated with values of a metric (e.g., a metric reflecting PE cycle count). Look-up table 430 may include PE cycle columns, wordline group rows, and/or delay duration cells. Values corresponding to PE cycle counts stored in the PE cycle columns and/or values corresponding to wordline group numbers may relate to predetermined delay durations and/or wordline group compositions. For example, for a given PE cycle count (e.g., 431), a wordline x0 may be in wordline group 1, and a predetermined delay 441 may be assigned to a programming operation performed with respect to wordline x0. In another example, for a given PE cycle count (e.g., 425), wordlines x7-x10 may be in wordline group 3, and a predetermined delay 465 may be assigned to a programming operation performed with respect to wordlines x7-x10. Some predetermined delays stored in look-up table 430 may have zero duration (e.g., no delay). Look-up table 430 may store data for any number of PE cycle counts and/or wordline groups. Look-up table 430 may indicate groups of wordlines coupled to memory cells with heightened susceptibilities to program disturb due to a heightened PE cycle count. Look-up table 430 may be stored in a controller memory (e.g., local memory 119 of FIG. 1A). In some embodiments, look-up table 430 may contain data that correlates values of a first metric (e.g., PE cycle count) with one or more predetermined delay durations and/or one or more wordline group sizes. In some embodiments, the delay indicated by look-up table 430 may be up to one second. In some embodiments, the delay duration may be one millisecond (e.g., 0.001 seconds). In some embodiments, the delay duration may be between one second and one millisecond. However, it is contemplated that the delay duration can be, in some embodiments, longer than one second or shorter than one millisecond.

Referring back to FIG. 4A, at block 416, in some embodiments, the controller determines whether a given wordline coupled to memory cells to be programmed belongs to the wordline group (e.g., the wordline group indicated by look-up table 430). As discussed above, the wordline group may be a group of wordlines coupled to memory cells having a heightened susceptibility to program disturb (e.g., having a low reliability). In some embodiments, memory cells coupled to wordlines of the wordline group may have a PE cycle count that exceeds a threshold value. For example, where the PE cycle count is a first amount (e.g., PE cycle count 433), the controller may determine that a first wordline (e.g., wordline x0) belongs to the wordline group (e.g., wordline group 1). Conversely, the controller may determine that a fourth wordline (wordline x3) does not belong to the wordline group (wordline group 1) responsive to the look-up table (430) indicating the wordline group (wordline group 1) includes three wordlines (e.g., wordlines x0-x2). In another example, where the PE cycle is a second amount (e.g., different from the first amount, more than the first amount, PE cycle count 434), the controller may determine that the fourth wordline (wordline x3) belongs to the wordline group (wordline group 1) responsive to the look-up table indicating the wordline group includes four wordlines (e.g., wordlines x0-x3). In such an example, the controller may determine that the fifth wordline (wordline x4) does not belong to the wordline group (wordline group 1). If the wordline to be programmed belongs to the wordline group, the method may proceed to block 420. If the given wordline does not belong to the wordline group, the method may proceed to block 418.

At block 420, in some embodiments, the controller performs a programming operation (e.g., a two-pass programming operation) on the memory cells coupled to the given wordline. Responsive to determining that the given wordline belongs to the wordline group, in some embodiments, the controller performs the two-pass programming operation with a delay between a first pass operation of the two-pass programming operation and a second pass operation of the two-pass programming operation. Including the delay between the first pass and the second pass may mitigate program disturb, especially for memory cells having a low reliability (e.g., low RWB). The controller may perform the two-pass programming operation using the programming sequence 510 described with respect to FIG. 5A or the programming sequence 520 described with respect to FIG. 5B.

Increasing a duration of the delay may increase the reliability of a memory cell. As an example, a delay duration of 0.1 seconds may increase the memory cell reliability (e.g., increase the RWB of the memory cell, decrease the memory cell's susceptibility to program disturb, increase and/or decrease relevant reliability metrics, etc.) a first amount. A delay duration of 0.5 seconds may increase a memory cell reliability a second amount. The second amount may be more than the first amount. As a further example, a delay duration of 0.01 second may increase a memory cell reliability a third amount. The third amount may be less than the first amount. In some embodiments, a delay between a first pass operation and a second pass operation of a two-pass programming operation may be one millisecond (e.g., 0.001 seconds). In some embodiments, the delay duration may be up to one second. In some embodiments, the delay duration may be between one second and one millisecond. However, it is contemplated that the delay duration can be, in some embodiments, longer than one second or shorter than one millisecond.

At block 418, in some embodiments, the controller performs a two-pass programming operation on the memory cells coupled to the given wordline. Responsive to determining that the given wordline does not belong to the wordline group, in some embodiments, the controller implements the two-pass programming operation without a delay between a first pass and a second pass of the two-pass programming operation. The controller selectively applying the delay based on data contained in the look-up table may enhance the performance of the two-pass programming operation (e.g., mitigate program disturb, etc.) without unduly sacrificing programming time.

At block 422, in some embodiments, the controller determines whether the wordline coupled to the memory cells programmed in block 420 or block 418 is the final wordline with memory cells to be programmed (e.g., whether the wordline is the final wordline corresponding to the programming command received in block 410). If the wordline coupled to the memory cells programmed in block 420 or block 418 is not the final wordline coupled to memory cells corresponding to the programming command, the method proceeds to block 424. At block 424, in some embodiments, the controller commences programming memory cells of the next wordline coupled to memory cells corresponding to the programming command. The method may proceed to block 416 from block 424. If the wordline coupled to the memory cells programmed in block 420 or block 418 is the final wordline having memory cells corresponding to the programming command, the method may proceed to block 426. At block 426, in some embodiments, the method 400 may be finished.

Figure 5A:
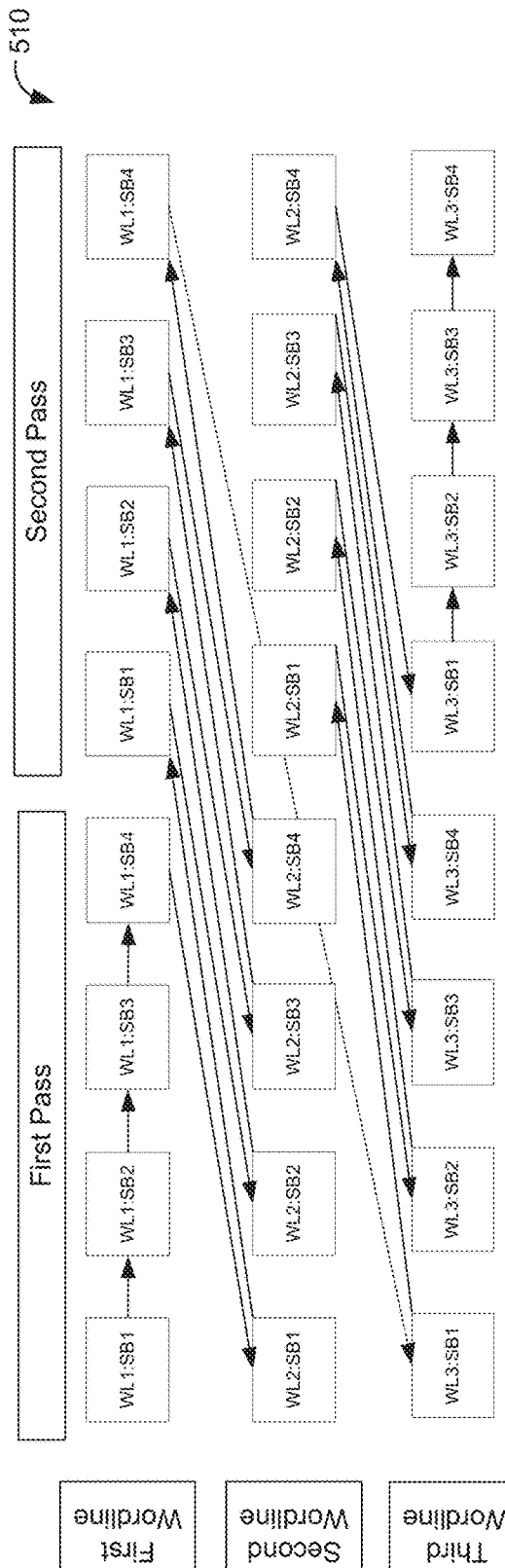
FIGS. 5A-5B depict an example of an adaptive programming sequence of an adaptive programming delay scheme at a memory sub-system, in accordance with some embodiments of the present disclosure.

FIG. 5A depicts an example of an adaptive programming sequence 510 of a programming delay scheme at a memory sub-system, in accordance with some embodiments of the present disclosure. Programming sequence 510 may be referred to as a wordline first programming sequence. Programming sequence 510 is illustrated as a programming sequence for programming four first sub-blocks coupled to a first wordline, four second sub-blocks coupled to a second wordline, and four sub-blocks coupled to a third wordline. However, in many embodiments, programming sequence 510 can be implemented for programming any number of sub-blocks coupled to any number of wordlines. In some embodiments, a sub-block includes one or more memory cells. Programming sequence 510 can be implemented by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the programming sequence 510 is performed by the adaptive programming component 113 of FIG. 1A. In other or similar embodiments, the programming sequence 510 is performed by another component of the memory sub-system controller 115, or by a component of local media controller 135. Programming sequence 510 may be implemented by a processing device (e.g., a controller, a processor, etc.) performing a programming operation (e.g., a two-pass programming operation). In some embodiments, programming sequence 510 may be a source to drain program sequence or a drain to source program sequence.

In some embodiments, programming sequence 510 begins by performing a first pass on a group of sub-blocks coupled to a first wordline. The first wordline may be coupled to a set of sub-blocks (e.g., a set of four sub-blocks) that are to be programmed first in sequential order of a programming operation. Subsequent sets of sub-blocks coupled to a second wordline, a third wordline, etc. may be programmed after the sub-blocks coupled to the first wordline are programmed. The first pass may be a "coarse" pass of the two-pass programming operation. As illustrated, the programming sequence 510 may begin by performing a first pass programming operation on a first sub-block coupled to a first wordline (e.g., WL1:SB1). The programming sequence 510 may then include performing the first pass programming operation on a second sub-block coupled to the first wordline (WL1:SB2) and so on, as indicated by the arrows in FIG. 5A.

After performing the first pass operation on the fourth sub-block coupled to the first wordline (WL1:SB4), the programming sequence 510 may proceed by performing a first pass programming operation on a first sub-block coupled to the second wordline (WL2:SB1). Next, the program sequence may include performing a second pass programming operation on the first sub-block coupled to the first wordline (WL1:SB1) as indicated by the arrows. The second pass may be a "fine" pass of the two-pass programming operation. Next, the program sequence may include performing a first pass programming operation on a second sub-block coupled to the second wordline (WL2:SB2), followed by performing the second pass programming operation on the second sub-block coupled to the first wordline (WL1:SB2). In some embodiments, programming sequence 510 continues alternating between the first pass operation on the next sub-block in the series coupled to the second wordline and the second pass operation on the next sub-block in the series coupled to the first wordline until a second pass operation has been performed on all the sub-blocks coupled to the first wordline and a first pass operation has been performed on all the sub-blocks coupled to the second wordline. Alternating between a first pass operation and a second pass operation on sub-blocks coupled to the second wordline and the first wordline respectively as described above may introduce programming errors on memory cells susceptible to program disturb. A delay may be included between a first pass programming operation (e.g., on WL2:SB1) and a second pass programming operation (e.g., on WL1:SB1) to mitigate program disturb.

In some embodiments, the programming sequence 510 next performs the first pass programming operation on a first sub-block coupled to a third wordline (WL3:SB1). The programming sequence 510 may next include alternating between performing the first pass programming operation on sub-blocks coupled to the third wordline (e.g., WL3:SB1, WL3:SB2, etc.) and performing the second pass programming on sub-blocks coupled to the second wordline (e.g., WL2:SB1, WL2:SB2, etc.) similar to the manner described above with respect to the sub-blocks coupled to the first and second wordlines. In some embodiments, the programming sequence 510 further includes performing the second pass programming operation on the sub-blocks coupled to the third wordline (e.g., WL3:SB1 through WL3:SB4). In some embodiments, the programming sequence 510 continues programming sub-blocks coupled to a subsequent wordline (e.g., a fourth wordline, a fifth wordline, etc.), alternating between a second pass operation on sub-blocks coupled to the previous (e.g., third) wordline and a first pass operation on sub-blocks coupled to the subsequent wordline. As mentioned above, alternating between the first pass operation and the second pass operation on sub-blocks coupled to the subsequent wordline and the second wordline respectively may introduce programming errors on memory cells susceptible to program disturb. A delay may be included between a first pass programming operation (e.g., on WL3:SB1) and a second pass programming operation (e.g., on WL2:SB1) to mitigate program disturb.

In some embodiments, including a delay between a first pass operation and a second pass operation (e.g., between a first pass of WL2:SB1 and a second pass of WL1:SB1, between a first pass of WL2:SB2 and a second pass of WL1:SB2, etc.) may mitigate program disturb. However, including the delay between the multiple alternating programming operations (e.g., alternating between a first pass operation and a second pass operation) as described in programming sequence 510 may mitigate program disturb at the expense of overall speed of the two-pass programming operation. A programming sequence which reduces the number of delays is discussed below.

Figure 5B:
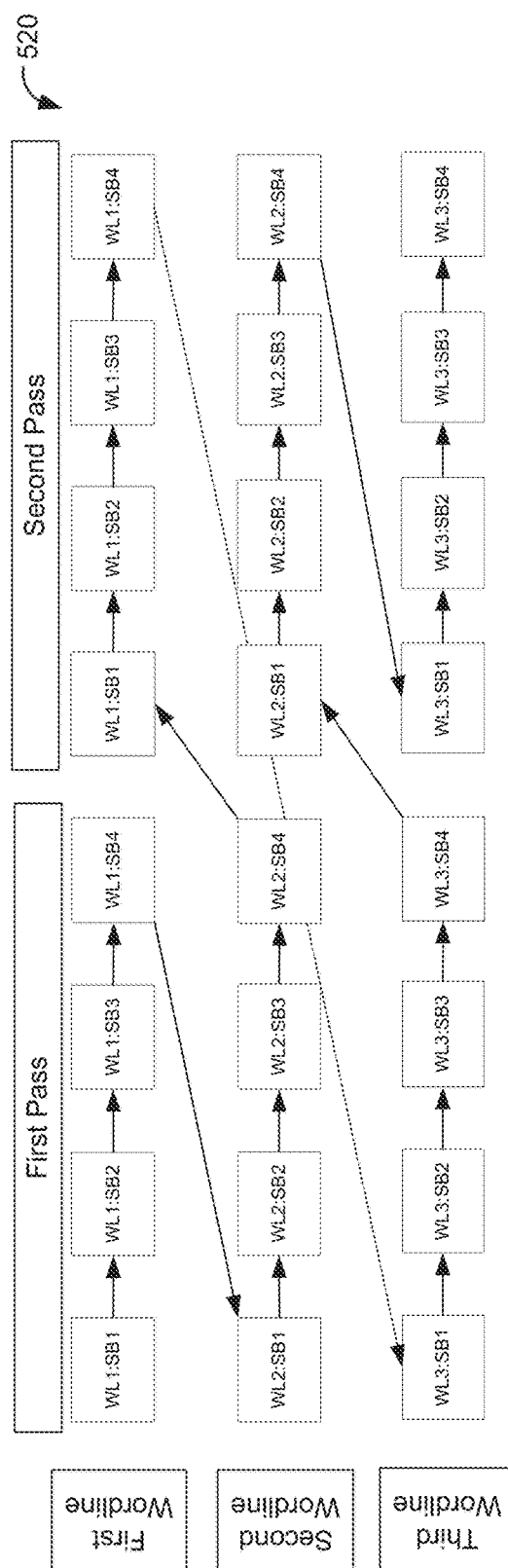

FIG. 5B depicts an example of an adaptive programming sequence 520 of a programming delay scheme for two pass programming at a memory sub-system, in accordance with some embodiments of the present disclosure. Programming sequence 520 may be referred to as a sub-block first programming sequence. Programming sequence 520 is illustrated as a programming sequence for programming four first sub-blocks coupled to a first wordline, four second sub-blocks coupled to a second wordline, and four sub-blocks coupled to a third wordline. However, in some embodiments, programming sequence 520 can be implemented for programming any number of sub-blocks coupled to any number of wordlines. Programming sequence 520 can be implemented by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the programming sequence 520 is performed by the adaptive programming component 113 of FIG. 1A. In other or similar embodiments, the programming sequence 520 is performed by another component of the memory sub-system controller 115, or by a component of local media controller 135. Programming sequence 520 may be implemented by a processing device (e.g., a controller, a processor, etc.) performing a two-pass programming operation. In some embodiments, programming sequence 520 may be a source to drain program sequence or a drain to source program sequence.

In some embodiments, programming sequence 520 begins by performing a first pass on a first set of sub-blocks coupled to a first wordline. The first wordline may be coupled to a set of sub-blocks (e.g., a set of four sub-blocks) that are to be programmed first in sequential order of a programming operation. Subsequent sets of sub-blocks coupled to a second wordline, a third wordline, etc. may be programmed after the sub-blocks coupled to the first wordline are programmed. The first pass may be a "coarse" pass of the two-pass programming operation. As illustrated, the programming sequence 520 may begin by performing a first pass programming operation on a first sub-block coupled to a first wordline (e.g., WL1:SB1). The programming sequence 520 may then include performing the first pass programming operation on a second sub-block coupled to the first wordline (WL1:SB2) and so on, as indicated by the arrows in FIG. 5B.

After performing the first pass operation on the fourth sub-block coupled to the first wordline (WL1:SB4), the programming sequence 520 may proceed by performing a first pass programming operation on a second set of sub-blocks coupled to a second wordline. The programming sequence 520 may include performing the first pass programming operation on a first sub-block coupled to the second wordline (WL2:SB1), followed by performing the first pass programming operation on a second sub-block coupled to the second wordline (WL2:SB2) and so on, as indicated by the arrows in FIG. 5B.

Following the first pass programming operations on the sub-blocks coupled to the second wordline (e.g., WL2:SB1 through WL2:SB4), the programming sequence 520 may proceed by performing a second pass programming operation on the first set of sub-blocks coupled to the first wordline. The programming sequence 520 may include performing the second pass programming operation on a first sub-block coupled to the first wordline (WL1:SB1). The programming sequence may include a delay between the first pass programming operation of WL2:SB4 and the second pass programming operation of WL1:SB1. The delay may mitigate program disturb. In some embodiments, the programming sequence 520 continues by performing the second pass programming operation on the sub-blocks coupled to the first wordline (e.g., WL1:SB1 through WL1:SB4).

In some embodiments, the programming sequence 520 may include performing the first pass programming operation on sub-blocks coupled to a third wordline (e.g., WL3:SB1 through WL3:SB4). Next, the programming sequence 520, in some embodiments, may include performing the second pass programming operation on the sub-blocks coupled to the second wordline (e.g., WL2:SB1 through WL2:SB4). Programming sequence 520 may include a delay between the first pass programming operation of WL3:SB4 and the second pass programming operation of WL2:SB1, in some embodiments. As discussed above, the delay may mitigate program disturb. In some embodiments, the programming sequence 520 further includes performing the second pass programming operation on the sub-blocks coupled to the third wordline (e.g., WL3:SB1 through WL3:SB4). In some embodiments, the programming sequence 520 continues programming sub-blocks coupled to a subsequent wordline (e.g., a fourth wordline, a fifth wordline, etc.), performing the first pass programming operation on all the sub-blocks of the subsequent wordline before performing the second pass programming operation on all the sub-blocks of the previous (e.g., third) wordline. In some embodiments, a delay is included between the first pass programming operation of the final sub-block of the subsequent wordline and the second pass programming operation of the first sub-block of the previous wordline. The delay may mitigate program disturb.

As discussed above, with reference to FIG. 5A, including a delay between a first pass programming operation and a second pass programming operation may mitigate program disturb at the expense of overall speed of the two-pass programming operation. However, where fewer delays are included (e.g., as in programming sequence 520 when compared to programming sequence 510), the overall speed of the two-pass programming operation may not be unduly affected. As discussed with respect to FIG. 5B, fewer delays are included in programming sequence 520 than compared to programming sequence 510 discussed with respect to FIG. 5A. Therefore, in some embodiments, where a delay is to be included between a first pass and a second pass of a two-pass programming operation, programming sequence 520 may provide a faster programming operation when compared to programming sequence 510.

A memory device having a low PE cycle count may include a number of memory cells having a reliability falling below a reliability threshold. Those memory cells may have a low RWB or may be more susceptible to program disturb compared to the memory cells having a reliability above the reliability threshold. Wordlines coupled to memory cells having a reliability falling below the reliability threshold may belong to a wordline group(s) (e.g., a wordline group discussed with respect to block 416 of FIG. 4A). In some embodiments, a delay (e.g., as discussed above with respect to FIGS. 4A-4B) can be included between a first pass and a second pass of a two-pass programming operation to mitigate the low reliability of the memory cells. In some embodiments, the delay may be included in the two-pass programming operation with respect to wordlines in the above mentioned wordline group(s). A delay may not be included in the two-pass programming operation with respect to wordlines not in the wordline group(s). Including the delay between the first pass and the second pass of the two-pass programming operation may effectively increase the reliability of the memory cells.

More wordlines may belong to the wordline group(s) in a memory device having an increased PE cycle count when compared to the PE cycle count discussed above. A delay may be included between the first pass and the second pass of a two-pass programming operation performed with respect to those wordlines in the wordline group(s). Again, including the delay between the first pass and the second pass of the two-pass programming operation may effectively increase the reliability of the memory cells.

Reliability of memory cells may degrade as the PE cycle count increases. In such memory devices, even more memory cells coupled to even more wordlines have a reliability falling below the reliability threshold. Therefore, in some embodiments, even more wordlines may belong to the wordline group(s) discussed above in memory devices having increased PE cycle counts compared to the PE cycle counts discussed above. A two-pass programming operation including a delay between a first pass and a second pass may be performed with respect to the memory cells coupled to the wordlines in the wordline group(s). Additionally, in some embodiments, a different delay may be included when performing the two-pass programming operation with respect to memory cells coupled to wordlines in a first wordline group compared to a second wordline group. Different delay durations between the first pass and the second pass of the two-pass programming operation may cause a different increase in effective reliability of the memory cells. The reliability (e.g., RWB, susceptibility to program disturb, etc.) of memory cells with reliability falling below the reliability threshold may be improved by including a delay between the first pass and the second pass of the two-pass programming operation.

Figure 6:
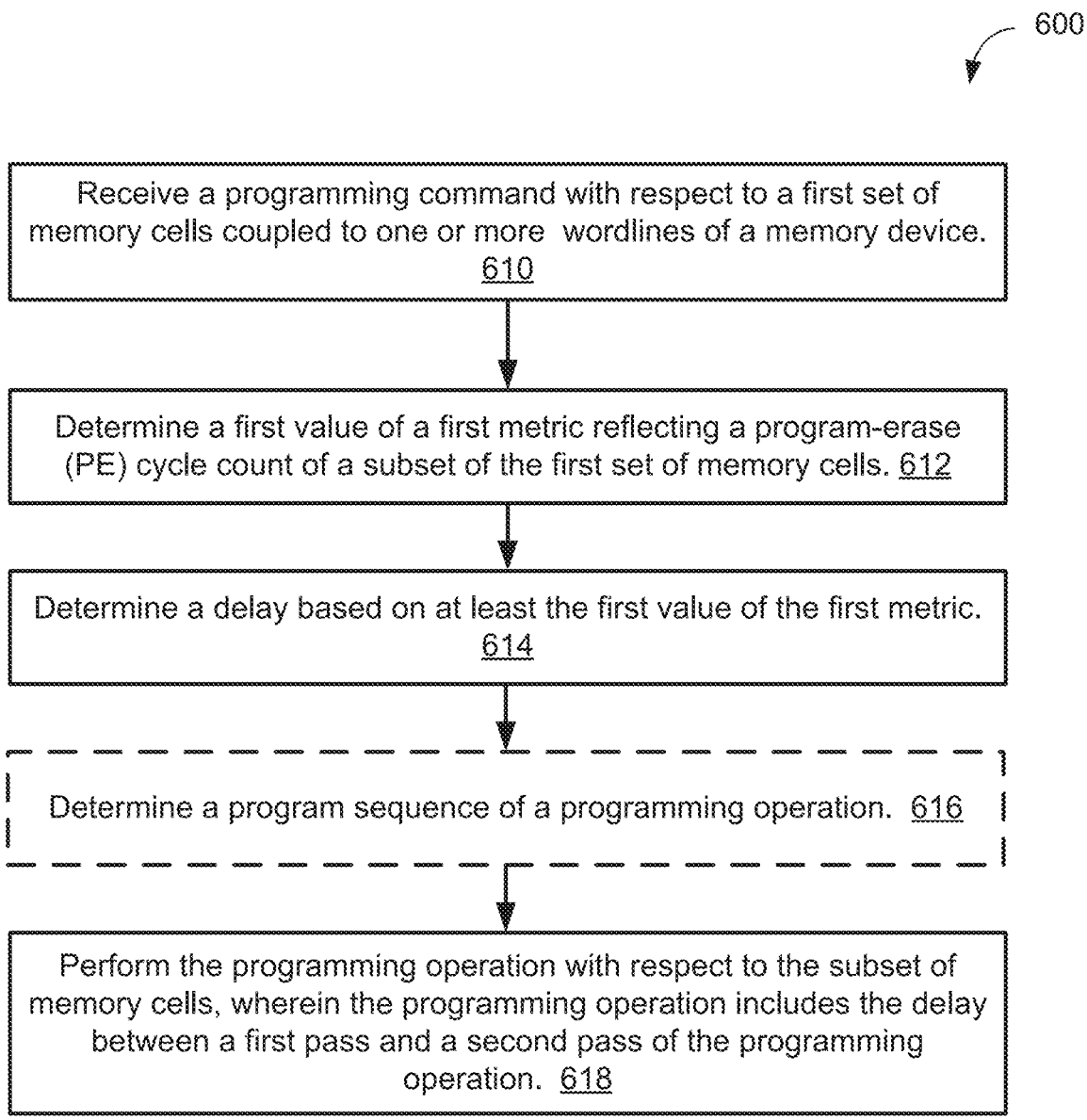
FIG. 6 depicts a flow chart for a method implementing an adaptive programming delay scheme at a memory sub-system, in accordance with some embodiments of the present disclosure.

FIG. 6 depicts a flow chart for method 600 implementing an adaptive programming delay scheme for two-pass programming at a memory sub-system, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the adaptive programming component 113 of FIG. 1A. In other or similar embodiments, one or more operations of method 600 is performed by another component of the memory sub-system controller, or by a component of local media controller 135. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 610, in some embodiments, processing logic may receive a programming command. The programming command may be with respect to a set of memory cells coupled to one or more wordlines of a memory device. The set of memory cells may be associated with a deck (e.g., a die) of the memory device. The programming command may be additionally with respect to another set of memory cells coupled to one or more additional wordlines of the memory device. The programming command may be a command to perform a programming operation (e.g., a two-pass programming operation) on at least the set of memory cells.

At block 612, in some embodiments, processing logic may determine a first value of a first metric. The first value and/or the first metric may reflect a PE cycle count of a subset of the set of memory cells. In some embodiments, processing logic determines the first value of the first metric responsive to receiving the PE cycle count. The PE cycle count may be indicative of a reliability of the subset of memory cells. For example, a high PE cycle count may indicate a low memory cell reliability. The first value may be indicative of a reliability (e.g., RWB, susceptibility to program disturb, etc.) of the subset of memory cells. In some embodiments, the first value and/or the first metric are associated with a PE cycle count of the memory cells of the subset. In some embodiments, the metric is a PE cycle count, and the value is a PE cycle count of the memory cells of the subset. The subset of memory cells may correspond to a wordline group (e.g., a first wordline group). The subset of memory cells may be coupled to a wordline belonging to a low-reliability wordline group. In some embodiments, the first subset of the first set of memory cells includes memory cells having a reliability falling below a predetermined reliability threshold. The first subset may include memory cells coupled to one or more wordlines of a wordline group(s) as discussed above. The first value (e.g., PE cycle count) may be received from a controller (e.g., memory sub-system controller 115 of FIG. 1A).

At block 614, in some embodiments, processing logic may determine a delay based on the first value of the first metric. For example, in some embodiments, processing logic may refer to a look-up table (e.g., look-up table 430 of FIG. 4B) storing delay durations with respect to given values of the first metric. The processing logic may determine the delay from a value of the look-up table. In an example, a look-up table may indicate that for a given PE cycle count, the delay is to be a certain duration. The look-up table may indicate that a duration of the delay is to be longer responsive to a subset of memory cells (e.g., coupled to wordlines of a wordline group) having a higher PE cycle count. In some embodiments, the processing logic may calculate the delay based on the first value of the first metric. For example, in some embodiments, processing logic may calculate a delay duration as a function of the first value of the first metric. The delay may be a delay to be included between a first pass and a second pass of a two-pass programming operation. In some embodiments, the delay reflects a difference between reliability of the memory cells and a predetermined memory reliability threshold.

At block 616, in some embodiments, processing logic may determine a program sequence of the programming operation. The processing logic may determine that the program sequence may be one of programming sequence 510 of FIG. 5A or programming sequence 520 of FIG. 5B. In some embodiments, processing logic may determine the program sequence based on the duration of the delay between a first pass and a second pass of the first two-pass programming operation. Processing logic may determine the program sequence such that fewer delays (e.g., between a first pass operation and second pass operation) are included in the program sequence when a delay duration exceeds a threshold duration. For example, in instances where the delay may have a short duration, programming sequence 510 may be used. In instances where the delay may have a comparatively longer duration, programming sequence 520 may be used because fewer delays are included. The threshold duration may be a duration that triggers the processing logic to select and/or determine a program sequence to maximize the speed of the programming operation by including fewer delays in the sequence, thereby decreasing a total aggregate of the included delay durations.

At block 618, in some embodiments, processing logic may perform the programming operation with respect to the subset of the set of memory cells. The programming operation may include the delay between a first pass operation of the programming operation and a second pass operation of the programming operation. In some embodiments, the processing logic includes the delay between the first pass operation and the second pass operation when programming memory cells included in the subset. In some embodiments, the processing logic may perform the programming operation with respect to one or more subsets of the set of memory cells. In some embodiments, the processing logic may perform another programming operation with respect to another set and/or subset of memory cells. In some embodiments, the processing logic may perform a first programming operation including a first delay with respect to a first set and/or first subset of memory cells and may perform a second programming operation without a delay or with a second delay with respect to a second set and/or a second subset of memory cells.

Figure 7:
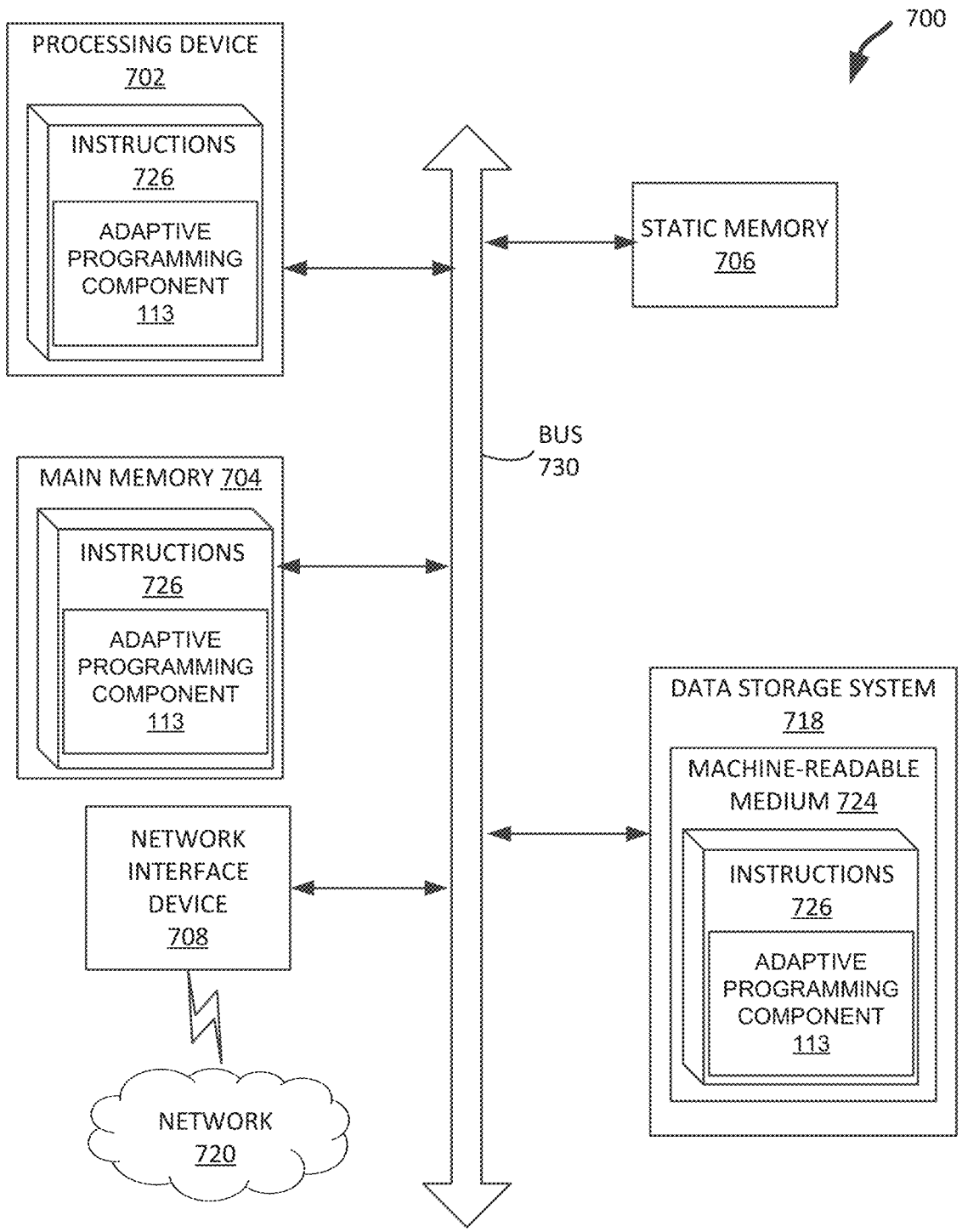
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the adaptive programming component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. Machine-readable storage medium 724 may be a non-transitory computer-readable storage medium. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a programming component (e.g., the adaptive programming component 113 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device operatively coupled with the memory device, the processing device configured to:
   receive a programming command with respect to a set of memory cells coupled to one or more wordlines of the memory device;
   determine a value of a metric reflecting a state of the set of memory cells;
   determine, using a look-up table, a delay and a size of a subset of the set of memory cells, the delay and the size corresponding to the value of the metric reflecting the state, wherein the look-up table correlates metric values with respective delay values and with respective sizes of the subset of memory cells; and
   perform a programming operation with respect to the subset of the set of memory cells, wherein the programming operation comprises the delay between a first pass of the programming operation and a second pass of the programming operation.

2. The system of claim 1, wherein the processing device is further configured to:
   determine a program sequence of the programming operation, wherein the program sequence comprises:
   performing a first pass of the programming operation on a set of sub-blocks coupled to a first wordline of the one or more wordlines of the memory device; and
   performing a second pass of the programming operation on a subset of the set of sub-blocks coupled to the first wordline.

3. The system of claim 1, wherein to determine the size of the subset of memory cells, the processing device is further configured to:
   determine, based on the value of the metric reflecting the state of the subset of the set of memory cells, a number of wordlines in a wordline group corresponding to the subset of the set of memory cells.

4. The system of claim 3, wherein the look-up table further correlates metric values with one or more of the number of wordlines in the wordline group, and wherein the one or more of the number of wordlines in the wordline group is determined based on one or more values stored in the look-up table.

5. The system of claim 3, wherein the processing device is further configured to:
   determine that a wordline coupled to one or more memory cells to be programmed belongs to the wordline group, wherein the value of the metric reflecting the state of the one or more memory cells to be programmed exceeds a threshold value.

6. The system of claim 1, wherein the processing device is further configured to:
   determine a program-erase (PE) cycle count of the set of memory cells based on the value of the metric.

7. The system of claim 1, wherein the programming operation uses one of a source to drain program sequence or a drain to source program sequence.

8. A method comprising:
   receiving a programming command with respect to a set of memory cells coupled to one or more wordlines of a memory device;
   determining a value of a metric reflecting a state of a set of memory cells;

determining, using a look-up table, a delay and a size of a subset of the set of memory cells, the delay and the size corresponding to the value of the metric reflecting the state, wherein the look-up table correlates metric values with respective delay values and with respective sizes of the subset of memory cells; and performing a programming operation with respect to the subset of the set of memory cells, wherein the programming operation comprises the delay between a first pass of the programming operation and a second pass of the programming operation.

9. The method of claim 8 further comprising:
determining a program sequence of the programming operation, wherein the program sequence comprises:
performing a first pass of the programming operation on a set of sub-blocks coupled to a first wordline of the one or more wordlines of the memory device; and
performing a second pass of the programming operation on a subset of the set of sub-blocks coupled to the first wordline.

10. The method of claim 8, wherein determining the size of the subset of memory cells comprises:
determining, based on the value of the metric reflecting the state of the set of memory cells, a number of wordlines in a wordline group corresponding to the set of memory cells.

11. The method of claim 10, wherein the look-up table further correlates metric values with one or more of the number of wordlines in the wordline group, and wherein the one or more of the number of wordlines in the wordline group is determined based on one or more values stored in the look-up table.

12. The method of claim 10 further comprising:
determining that a wordline coupled to one or more memory cells to be programmed belongs to the wordline group, wherein the value of the metric reflecting the state of the one or more memory cells to be programmed exceeds a threshold value.

13. The method of claim 8 further comprising:
determining a program-erase (PE) cycle count of the set of the set of memory cells based on the value of the metric.

14. The method of claim 8, wherein the programming operation uses one of a source to drain program sequence or a drain to source program sequence.

15. A non-transitory computer-readable storage medium comprising instructions that, when executed by a processing device, cause the processing device to:
receive a programming command with respect to a set of memory cells coupled to one or more wordlines of a memory device;
determine a value of a metric reflecting a state of a subset of the set of memory cells;
determine, using a look-up table, a delay and a size of a subset of the set of memory cells, the delay and the size corresponding to the value of the metric reflecting the state, wherein the look-up table correlates metric values with respective delay values and with respective sizes of the subset of memory cells; and
perform a programming operation with respect to the subset of the set of memory cells, wherein the programming operation comprises the delay between a first pass of the programming operation and a second pass of the programming operation.

16. The non-transitory computer-readable storage medium of claim 15, wherein the processing device is further to:
determine a program sequence of the programming operation, wherein the program sequence comprises:
performing a first pass of the programming operation on a set of sub-blocks coupled to a first wordline of the one or more wordlines of the memory device; and
performing a second pass of the programming operation on a subset of the set of sub-blocks coupled to the first wordline.

17. The non-transitory computer-readable storage medium of claim 15, wherein to determine the size of the subset of memory cells, the processing device is further to:
determine, based on the value of the metric reflecting the state of the subset of the set of memory cells, a number of wordlines in a wordline group corresponding to the subset of the set of memory cells.

18. The non-transitory computer-readable storage medium of claim 17, wherein the processing device is further to:
determine that a wordline coupled to one or more memory cells to be programmed belongs to the wordline group, wherein the value of the metric reflecting the state of the one or more memory cells to be programmed exceeds a threshold value.

19. The non-transitory computer-readable storage medium of claim 15, wherein the processing device is further to:
determine a program-erase (PE) cycle count of the set of memory cells based on the value of the metric.

20. The non-transitory computer-readable storage medium of claim 15, wherein the programming operation uses one of a source to drain program sequence or a drain to source program sequence.

* * * * *